United States Patent
Park et al.

(10) Patent No.: US 7,186,299 B2
(45) Date of Patent: Mar. 6, 2007

(54) METHOD OF RINSING AND DRYING SEMICONDUCTOR SUBSTRATES

(75) Inventors: Ki Hwan Park, Suwon-Si (KR); Jong Kook Song, Suwon-Si (KR); Mo Hyun Cho, Suwon-Si (KR); Sung-Ho Jo, Kunggi-Do (KR); Sun Jae Lee, Suwon-Si (KR); Pyung Ho Lim, Osan-Si (KR); Dong Wook Cho, Daegu-Kyongyuksi (KR)

(73) Assignee: Samsung Electronics, Co., Ltd. (KR)

( * ) Notice: Subject to any disclaimer, the term of this patent is extended or adjusted under 35 U.S.C. 154(b) by 96 days.

(21) Appl. No.: 10/796,507

(22) Filed: Mar. 9, 2004

(65) Prior Publication Data

US 2005/0087211 A1 Apr. 28, 2005

(30) Foreign Application Priority Data

Oct. 28, 2003 (KR) ...................... 10-2003-0075573

(51) Int. Cl.
*B08B 3/10* (2006.01)
(52) U.S. Cl. ............................ 134/26; 134/18; 134/19; 134/21; 134/36; 134/37; 134/902; 34/60; 34/78

(58) Field of Classification Search ................. 134/19, 134/21, 26, 36, 37, 902, 18; 34/60, 78
See application file for complete search history.

(56) References Cited

U.S. PATENT DOCUMENTS

| 5,115,576 | A | 5/1992 | Roberson et al. ............... 34/15 |
| 5,715,612 | A | 2/1998 | Schwenkler ................. 34/470 |
| 6,284,055 | B1 | 9/2001 | Dryer et al. .................. 134/10 |
| 6,328,809 | B1 | 12/2001 | Elsawy et al. ................. 134/3 |
| 2002/0174882 | A1 | 11/2002 | Kimura ........................ 134/21 |

FOREIGN PATENT DOCUMENTS

KR  2003-0063229  7/2003

*Primary Examiner*—Zeinab El-Arini
(74) *Attorney, Agent, or Firm*—Mills & Onello LLP

(57) ABSTRACT

A method for cleaning and drying semiconductor wafers improves device yield by providing more advanced control of the ratio of drying fluid to cleaning fluid, for example the ratio of N2 vapor to IPA vapor. In addition, a quick drain process is employed to improve process throughput, and to further improve particle and watermark removal during the cleaning and drying steps.

13 Claims, 8 Drawing Sheets

* CONDITION OF EXPERIMENT
TEMPERATURE OF IPA : 130°C
TEMPERATURE OF IPA TANK: 65°C
EXHAUST PRESSURE : 75 mmH₂O

METHOD OF RINSING AND DRYING SEMICONDUCTOR SUBSTRATES

BACKGROUND OF THE INVENTION

During the manufacture of semiconductor devices arranged in arrays on wafer substrates, the wafers are subjected to various chemical treatments. The treatments are in the form of a number of process steps that the wafers undergo during the formation of devices, including the formation of, processing of, and removal of, layers, photolithography processes, and the like. Following certain steps, extraneous particles can remain on the substrate, which can have an adverse effect on subsequent processes. In contemporary fabrication techniques, the substrates are rinsed and dried to remove such particles.

For rinsing the wafers, it is common to use deionized water (DI) or a commercial cleaning solution such as SC1. When drying the substrate, isopropyl alcohol (IPA) is commonly used. However, IPA-based drying processes commonly leave particles and watermarks on the substrates. To improve the IPA-based drying process, a drying technique referred to as the Marongoni technique, has become popular.

In the Marongoni technique, the wafers are slowly lifted out of the DI bath, or the DI bath is slowly drained. At this time, the exposed wafers are immersed in an IPA vapor. Since the concentration of the IPA vapor is highest at the interface with the DI bath, the resulting surface tension of the water is low in this region. This results in a phenomenon referred to as Marongoni flow of the DI water bath away from the wafer surfaces, thereby drying the wafer surfaces. While the Marongoni approach is somewhat effective for removing particles from the wafers, because the slow drain procedure drastically reduces process throughput. For example, the drain time may be on the order of 225 seconds for a 12 inch wafer. In addition, watermarks can remain on the substrate following a Marongoni flow procedure.

To improve the effectiveness of the removal of particles and watermarks by the IPA vapor, heated nitrogen gas $N_2$ can also be introduced into the process chamber. This technique is disclosed in U.S. Pat. No. 6,328,809, the content of which is incorporated herein by reference. With reference to FIG. 1, in this approach, the IPA vapor is transported into a wafer process chamber using a source of heated nitrogen gas. Referring to FIG. 1, nitrogen from a nitrogen gas source $N_2$ flows through valve 11, is heated at heater 12, and flows through valve 15A into a tank 10 containing IPA solution. The IPA solution is partially heated into a vapor within the tank by heater 14. The pressure of the heated nitrogen gas forces the combined nitrogen and IPA gases to flow through valve 15C and into the process chamber 20. The combined IPA/$N_2$ gas is introduced into the process chamber 20 to carry out an IPA decontaminating step. During this step, valve 15B is closed. Following this, heated $N_2$ gas flows directly into the process chamber by closing valves 15A and 15C and opening valve 15B in a purge step, in order to volatize any condensed IPA remaining on the wafers.

To ensure the removal of particles and watermarks, the ratio of nitrogen gas to IPA gas in the process chamber is a critical factor during the IPA decontaminating step, since the ratio is closely correlated with device yield. However, control over this ratio is limited in the conventional approaches, since the nitrogen gas is used exclusively as a transport medium for the IPA gas during the decontaminating procedure.

SUMMARY OF THE INVENTION

The present invention is directed to a system and method for rinsing, decontaminating and drying semiconductor wafers in a manner that improves yield by providing more advanced control of the ratio of drying fluid to cleaning fluid, for example the ratio of $N_2$ vapor to IPA vapor. In addition, a quick drain process is employed to improve process throughput, and to further improve particle and watermark removal during the rinsing, decontamination, and drying steps.

In one aspect, the present invention is directed to a system for processing semiconductor wafers. A first inlet for a first supply of drying fluid is provided. A second inlet for a second supply of drying fluid is also provided. The rate of supply of the second supply of drying fluid is independent of that of the first supply of drying fluid. A decontaminating fluid tank stores a supply of decontaminating fluid, the decontaminating fluid tank having an inlet for receiving the second supply of drying fluid, and having an outlet for supplying decontaminating fluid at a rate that is based on the rate of supply of the second supply of drying fluid. A process chamber houses the semiconductor wafers to be cleaned and dried. The process chamber includes an inlet for simultaneously receiving the first supply of drying fluid and the supply of decontaminating fluid.

The first supply of drying fluid and second supply of drying fluid comprise, for example, nitrogen gas. A first heater may be provided for heating the first supply of drying fluid between the first inlet and the process chamber. A second heater may be provided for heating the second supply of drying fluid between the second inlet and the decontaminating fluid tank.

A third heater may be coupled to the decontaminating fluid tank for heating the decontaminating fluid in the tank. The decontaminating fluid in the tank is partially heated by the third heater from a liquid into a vapor and the second supply of drying fluid drives the decontaminating fluid vapor through the outlet of the decontaminating fluid tank. The inlet of the decontaminating fluid tank may include a first inlet for receiving the second supply of drying fluid at a level below the level of the liquid and a second inlet for receiving the second supply of drying fluid at a level above the level of the liquid.

A fourth heater may be coupled to a line in turn coupled to the inlet of the process chamber for heating the first supply of drying fluid and the supply of decontaminating fluid prior to their release into the process chamber.

The first supply of drying fluid and the supply of decontaminating fluid received at the process chamber are preferably in a vapor state.

A coupling tube may be provided for selectively coupling the first supply of drying fluid to the decontaminating fluid tank. In addition, a coupling tube may be provided for selectively coupling the second supply of drying fluid directly to the process chamber. Also, a coupling tube may be provided for selectively coupling the first inlet to the second inlet.

The process chamber further comprises a drain, and a buffer tank is coupled to the drain of the process chamber. In one embodiment, the drain comprises a plurality of drains, and the plurality of drains are coupled to the buffer tank. The plurality of drains are, for example, of a width to ensure rapid draining of the process chamber, for example within a time period less than about 50 seconds, or, for example, within a time period ranging between about 7 and 17 seconds. The multiple drains are spaced apart in the process chamber to ensure that a top surface of a fluid to be drained from the process chamber remains level as the process chamber is drained. The buffer tank is preferably of a volume that is greater than or equal to the volume of the process chamber.

A first supply rate controller is provided for controlling the rate of supply of the first drying fluid and a second supply rate controller is provided for controlling the rate of supply of the second drying fluid, the first and second supply rate controllers being independent of each other such that the rate of supply of the first drying fluid and the rate of supply of the second drying fluid are independent relative to each other.

The process chamber may further comprise a plurality of exhaust ports distributed in the process chamber to provide for laminar flow of the decontaminating fluid and the drying fluid in the process chamber.

In another aspect, the present invention is directed to a method for processing semiconductor wafers. A first supply of drying fluid is provided and a second supply of drying fluid is also provided. The rate of supply of the second supply of drying fluid is independent of that of the first supply of drying fluid. A supply of decontaminating fluid is stored in a decontaminating fluid tank. The decontaminating fluid tank has an inlet for receiving the second supply of drying fluid, and has an outlet for supplying decontaminating fluid at a rate that is based on the rate of supply of the second supply of drying fluid. The first supply of drying fluid and the supply of decontaminating fluid are simultaneously supplied to a process chamber to decontaminate semiconductor wafers contained therein.

Prior to simultaneously supplying the first supply of drying fluid and the supply of decontaminating fluid to the process chamber, rinsing fluid, for example DI water, is supplied into the process chamber containing the semiconductor wafers for rinsing the semiconductor wafers. The rinsing fluid is then rapidly drained from the process chamber, for example into a buffer tank.

In a preferred embodiment, the rinsing fluid is completely drained prior to simultaneously supplying the first supply of drying fluid and the supply of decontaminating fluid to the process chamber.

Following simultaneously supplying the first supply of drying fluid and the supply of decontaminating fluid to the process chamber, a drying fluid, for example nitrogen gas, is supplied into the chamber for drying the semiconductor wafers.

Throughout the present specification and claims, the term "fluid" is used herein in a manner consistent with its historical definition, and therefore includes any non-solid form of matter, for example gases, vapors, and liquids.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
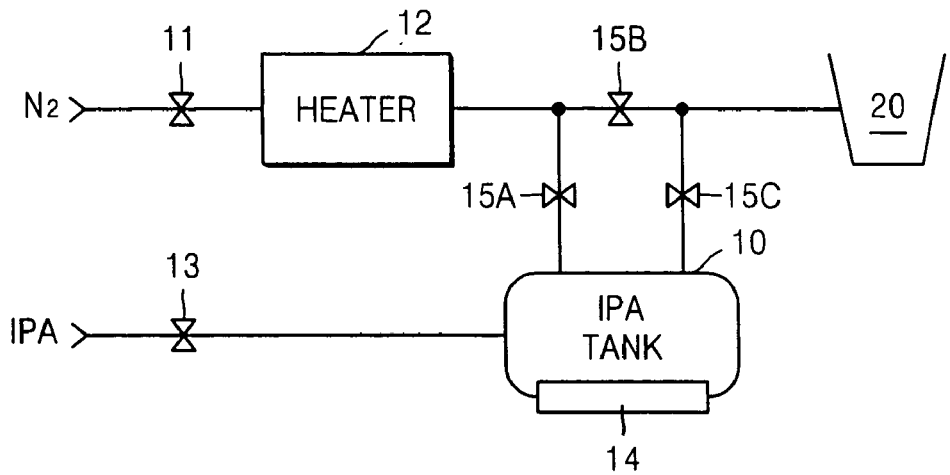
FIG. 1 is a schematic block diagram of a conventional cleaning and drying system for cleaning and drying semiconductor wafers.
Figure 2:
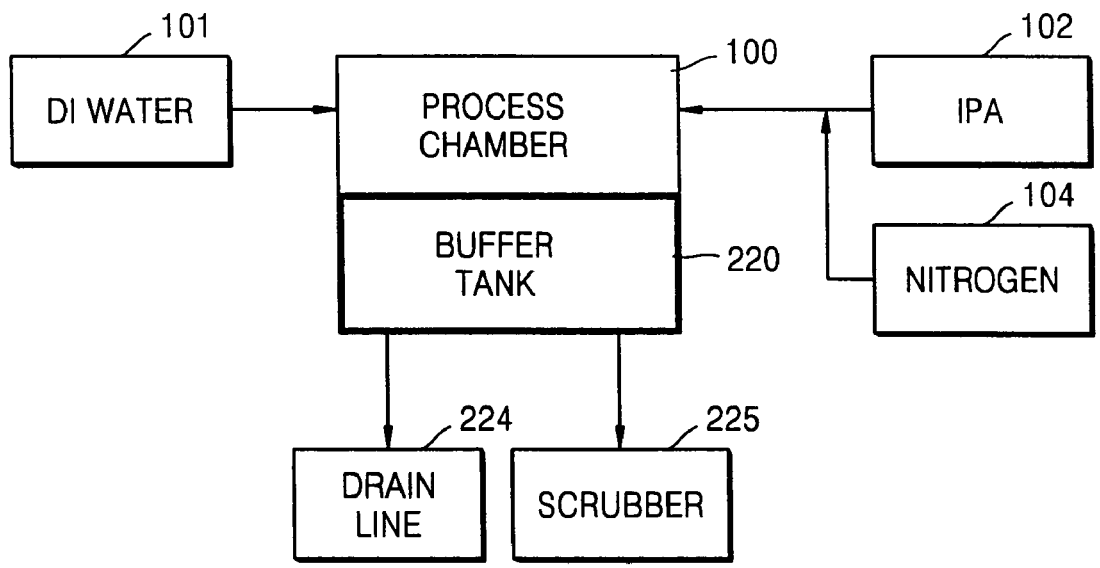
FIG. 2 is a block diagram of a cleaning and drying system, in accordance with the present invention.

FIG. 2 is a block diagram of a cleaning and drying system, in accordance with the present invention. The system includes a process chamber 100 within which semiconductor wafers are rinsed, decontaminated, and dried, a deionized (DI) water source 101 for rinsing the wafers, and an isopropyl alcohol (IPA) source 102 and nitrogen source 104 for decontaminating and drying the wafers. Following the rinsing step, waste rinse fluid from the process chamber 100 is rapidly drained through multiple drain lines 218 (described below) into a buffer tank 220 using a "quick-drain" process. The quick-drain process is described in further detail below. The buffer tank releases the waste rinse fluid through a drain line 224, and the waste fluid is treated in a waste facility. In addition, organic gases, for example IPA gases, are exhausted from the process chamber, for example, at exhaust ports 217 (described below), and treated at a scrubber 225 to prevent fire and release of toxins.

Figure 9:
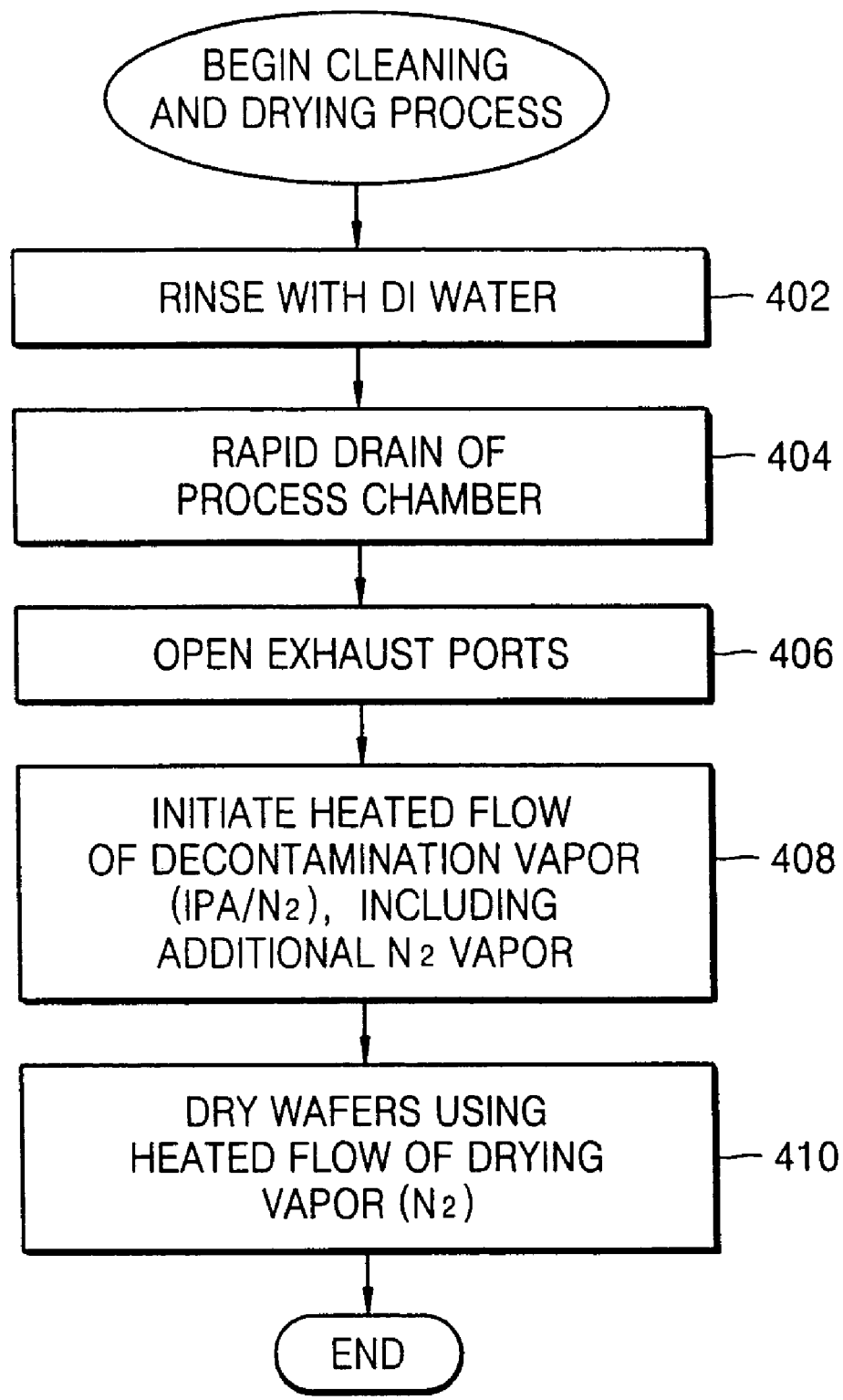
FIG. 9 is a flow diagram of a wafer cleaning and drying process, in accordance with the present invention.

The following process is described below with additional reference to the flow diagram of FIG. 9. To initiate the cleaning and drying process, the wafers to be processed are loaded into the process chamber 100. A rinsing operation is performed to remove process chemicals, for example etch chemicals. DI water provided by source 101 flows into the chamber prior to, or following, placement of the wafers so as to submerge the wafers. In one example, the DI water rinse fluid comprises hydrofluorine (HF)-buffered DI water. Alternatively, commercial cleaning solution, such as SC1, maybe used. The DI water flow continues, causing the process chamber to overflow, thereby thoroughly rinsing the surfaces of the wafers (step 402).

Following this, the DI water is rapidly drained from the process chamber 100, using the "quick-drain" apparatus described below, for example the draining tubes placed in less than about 50 seconds, and preferably within about 7–17 seconds (step 404). To accommodate the quick-drain, the DI water is released via a plurality of wide, evenly distributed, drain apertures into a buffer tank 220 that lies below the process chamber 100. The buffer tank 220 temporarily holds the waste fluid until it can be properly disposed via drain line 224.

In the decontamination step, the lid of the process chamber 100 is closed, gas exhaust ports of the chamber are opened (step 406), and a flow of heated IPA vapor from source 102 is delivered to the process chamber 100 to initiate the wafer drying process, and to further remove contaminants, for example contaminants in the form of particles, from the surfaces of the wafers (step 408). In one example, the heated IPA vapor 102 flows for about 90 seconds. The IPA vapor is delivered to the process chamber 100 using nitrogen 104 as a carrier vapor. In the present invention, during the decontamination step, the flow rate of nitrogen vapor is precisely controlled, in order to provide the process chamber environment with an optimal IPA-to-nitrogen ratio, which, in turn, provides for optimal cleaning, drying and removal of watermarks from the wafers.

In one example, the flow rate of nitrogen vapor is controlled by providing, in addition to the "carrier" nitrogen vapor flow used to drive the IPA vapor, a second, independent source of heated nitrogen gas into the process chamber 100 to ensure the proper IPA-to-nitrogen ratio in the chamber 100 (step 408). This second source of nitrogen is referred to below as the "purge" nitrogen vapor, since the second source can optionally later be used to purge the process chamber during the subsequent drying step. It should be noted, however, that the first source, or "carrier" nitrogen source, can also be used for the subsequent drying step, as described below. It has been determined that rapid draining of the DI water bath, during the rinsing step, combined with an optimized IPA-to-nitrogen ratio during the decontamination step, lead to optimal removal of particles from the wafers, as described below.

The IPA decontamination vapor of the decontamination step may be introduced during the quick-drain of the rinsing fluid, or, preferably, is introduced following completion of the quick-drain procedure. Experimental data indicates that IPA introduction following completion of the quick-drain procedure results in fewer particles remaining on the wafers. During the decontamination step, the plurality of drain lines from the process chamber 100 to the buffer tank 220 remain open. In addition, multiple gas exhaust lines 217 in the process chamber, described in further detail below, are open during this step. The operation of the multiple gas exhaust lines is described in further detail below.

Following this, heated nitrogen vapor, for example from the second nitrogen vapor source, is sprayed onto the wafers to dry the wafers (step 410). In one example, the nitrogen flow is activated for approximately 300 seconds. Again, during this step, the plurality of drain lines from the process chamber 100 to the buffer tank 220, as well as the gas exhaust lines, remain open in order to maintain uniform pressure in the chamber and to remove IPA from the chamber at the same time.

Following this, the process chamber exhaust lines and drain lines are closed. The lid of the chamber is then opened, and the cleaned and dried wafers are removed.

Figure 3:
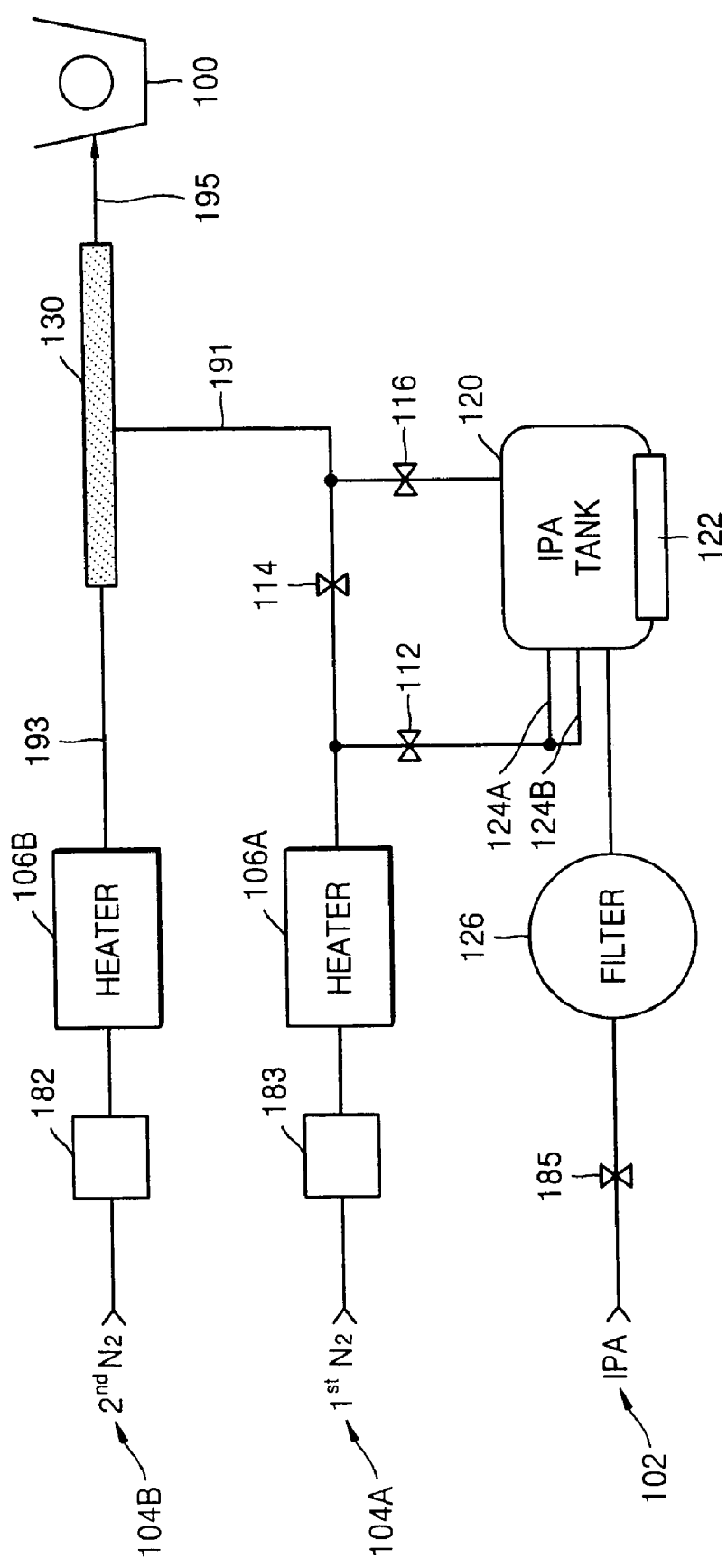
FIG. 3 is a schematic block diagram of a first cleaning and drying system for cleaning and drying semiconductor wafers in accordance with the present invention.

FIG. 3 is a schematic block diagram of a first cleaning and drying system for cleaning and drying semiconductor wafers in accordance with the present invention. In this embodiment, a first flow of nitrogen is provided by a first nitrogen source 104A. The rate of flow of the first nitrogen source 104A is controlled by a first mass flow controller (MFC) 183, in which an electrical signal is used to maintain a suitable flow rate.

The controlled flow of the first nitrogen source is heated by a first heater 106A to an appropriate temperature. A second flow of nitrogen is provided by a second nitrogen source 104B. The rate of flow of the second nitrogen source 104B is controlled by a second mass flow controller (MFC) 182. The controlled flow of the second nitrogen source is heated by a second heater 106B to an appropriate temperature. An IPA source 102 is coupled to an IPA tank 120. A filter 126 is provided for purifying the IPA solution prior to entry into the tank 120. Valve 185 enables the flow of IPA solution to the IPA tank 120.

IPA solution in liquid form pools in the bottom of the IPA tank 120. A heater 122 in the base of the IPA tank 120 vaporizes a portion of the IPA solution to generate an IPA vapor that resides above the solution.

As stated above, during an IPA-based decontaminating procedure, the IPA vapor located in the IPA tank 120 is transported into the process chamber 100 by the first flow 104A of heated nitrogen gas, i.e. the "carrier" nitrogen supply. During this step, valves 112 and 116 are open and valve 114 is closed. The nitrogen gas heated by the heater 106A flows through valve 112 into the IPA tank 120, where it reacts with the IPA vapor in the tank 120. The IPA vapor is then transported by the incident nitrogen vapor through valve 116, into the process chamber 100. An optional line heater 130 heats the combined nitrogen and IPA vapor supplied at line 191 to a predetermined temperature prior to entry into the process chamber 100. The line heater comprises, for example, a quartz plate/heating coil/quartz plate configuration which envelops the gas line. The line heater 130 maintains the temperature of the gases entering the process chamber 100, in order to increase the reliability of the semiconductor manufacturing process.

At the same time, during the IPA-based decontaminating procedure, in order to precisely control the IPA-to-nitrogen ratio of the decontaminating vapor entering the process chamber 100, a second source of heated nitrogen supplied at line 193 from the second nitrogen source 104B is provided, referred to above as the "purge" nitrogen source. As stated above, the rate of flow of the second source of nitrogen is precisely controlled, for example by the second MFC 182, in order to ensure the proper ratio. The vapor provided by the second source 104B at line 193 is also heated by the line heater 130, where it is mixed with the combined nitrogen/IPA vapor from line 191. Together, the first and second vapor sources arriving via lines 191 and 193 are provided to the process chamber 100 via line 195.

In a preferred embodiment, the line heater 130 heats the applied vapor such that it is released at line 195 at a temperature of about 130 C. At the same time, the first heater 106A operates to heat the first nitrogen gas source 104A to a temperature of about 100 C–120 C, the second heater 106B operates to heat the second nitrogen gas source 104B to a temperature of about 130 C–150 C, and the IPA tank heater 122 operates to heat the IPA solution in the tank to a temperature of about 50 C to 70 C. The operating temperature of the first heater 106A is preferably lower than the operating temperature of the second heater 106B, because a lower temperature is required for precisely controlling the delivery rate of the IPA vapor from the IPA tank 120.

As stated above, during the drying step, heated nitrogen gas flows directly into the process chamber 100, for volatizing any condensed IPA remaining on the wafers. During this step, valves 112 and 116 are closed, and valve 114 is open. The second "purge" nitrogen source 104B may optionally be used in conjunction with, or instead of, the first nitrogen source 104A for this step.

As an optional entry configuration for the heated nitrogen gas into the IPA tank, dual entry ports 124A, 124B may be provided. The first port 124A lies above the surface of the IPA solution in the tank, to serve as a pressurized transport mechanism for the IPA vapor lying above the solution surface, as described above. The second port 124B enters the IPA tank below the surface of the IPA solution, and mixes, or bubbles, directly with the IPA solution, to further activate the reaction with the IPA solution. In this manner, the interaction of the IPA solution with the nitrogen carrier vapor is enhanced.

Figure 4:
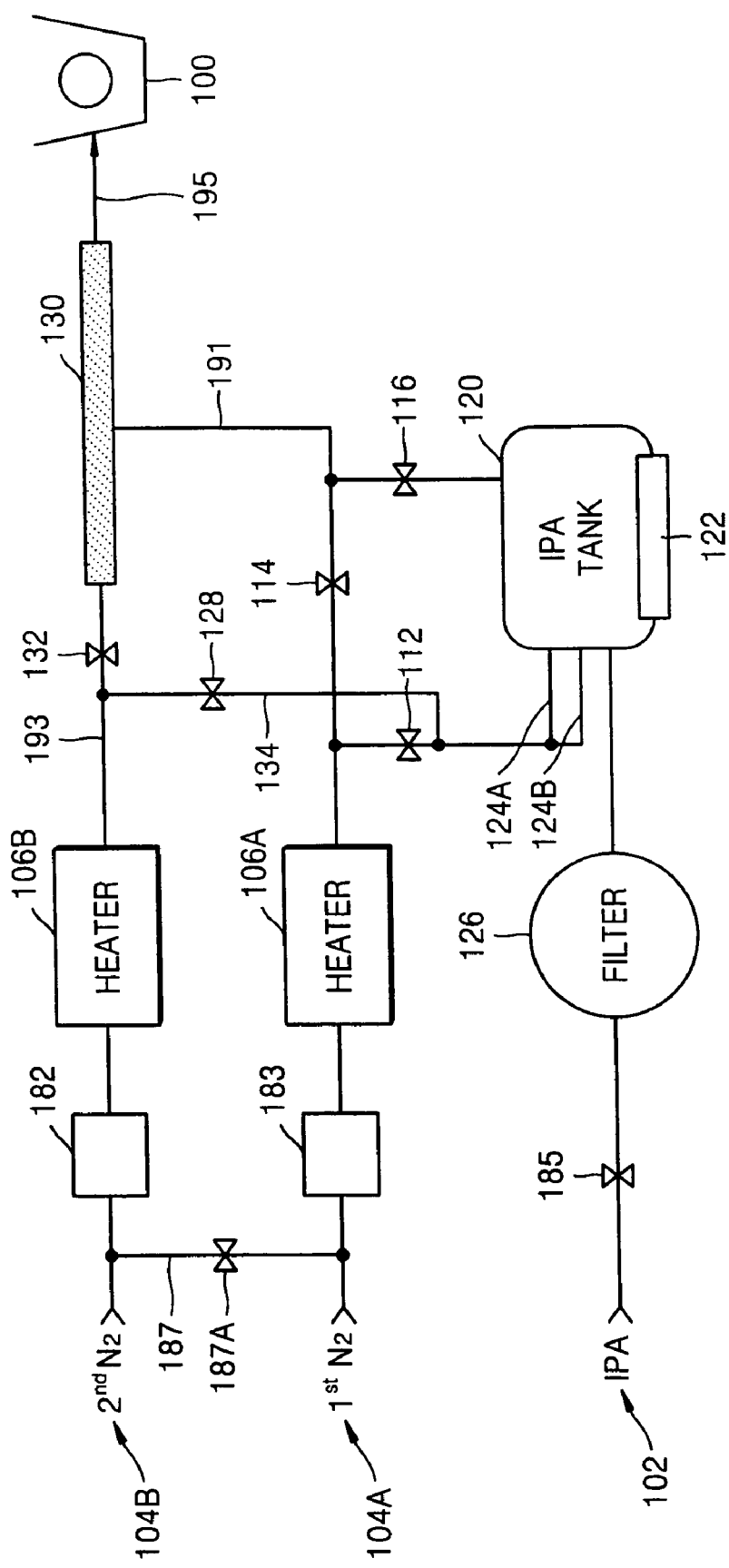
FIG. 4 is a schematic block diagram of a second cleaning and drying system for cleaning and drying semiconductor wafers in accordance with the present invention.

FIG. 4 is a schematic block diagram of a second cleaning and drying system for cleaning and drying semiconductor wafers in accordance with the present invention. This embodiment is similar in structure and performance to those of the first embodiment described above in connection with FIG. 3. However, in this embodiment, an additional flow line 134 is connected between the line 193 providing the heated second nitrogen source and the entry ports 124A, 124B of the IPA tank 120. This flow line 134 allows the second nitrogen source 104B to serve as a "carrier" vapor source for the IPA tank, for example to allow for servicing of the first MFC 183 or the first heater 106A without having to disrupt system operation. In this case, valve 132 is closed, valve 112 is closed, and valve 128 is open. At the same time, the first nitrogen source 104A may be directly applied to the process chamber 100, by opening valve 114 to initiate flow via line heater 130, after being mixed with the IPA/nitrogen vapor mixture at line 191. The roles of the first and second nitrogen sources 104A, 104B are thus temporarily reversed in this example to allow for servicing of the first MFC 183 and/or the first heater 106A.

In addition, this second embodiment provides an optional line 187 and related valve 187A that combines the first and second nitrogen sources 104A, 104B. It should be noted that while the first and second nitrogen sources 104A, 104B are illustrated as different, independent sources, they may, in fact comprise a common source that has two outlets, the flow of each outlet being independently controlled, for example by the first and second MFC's 183, 182. In this case, the common source should maintain a pressure great enough to source the combined flow rate of the MFCs 183, 182.

Figure 5:
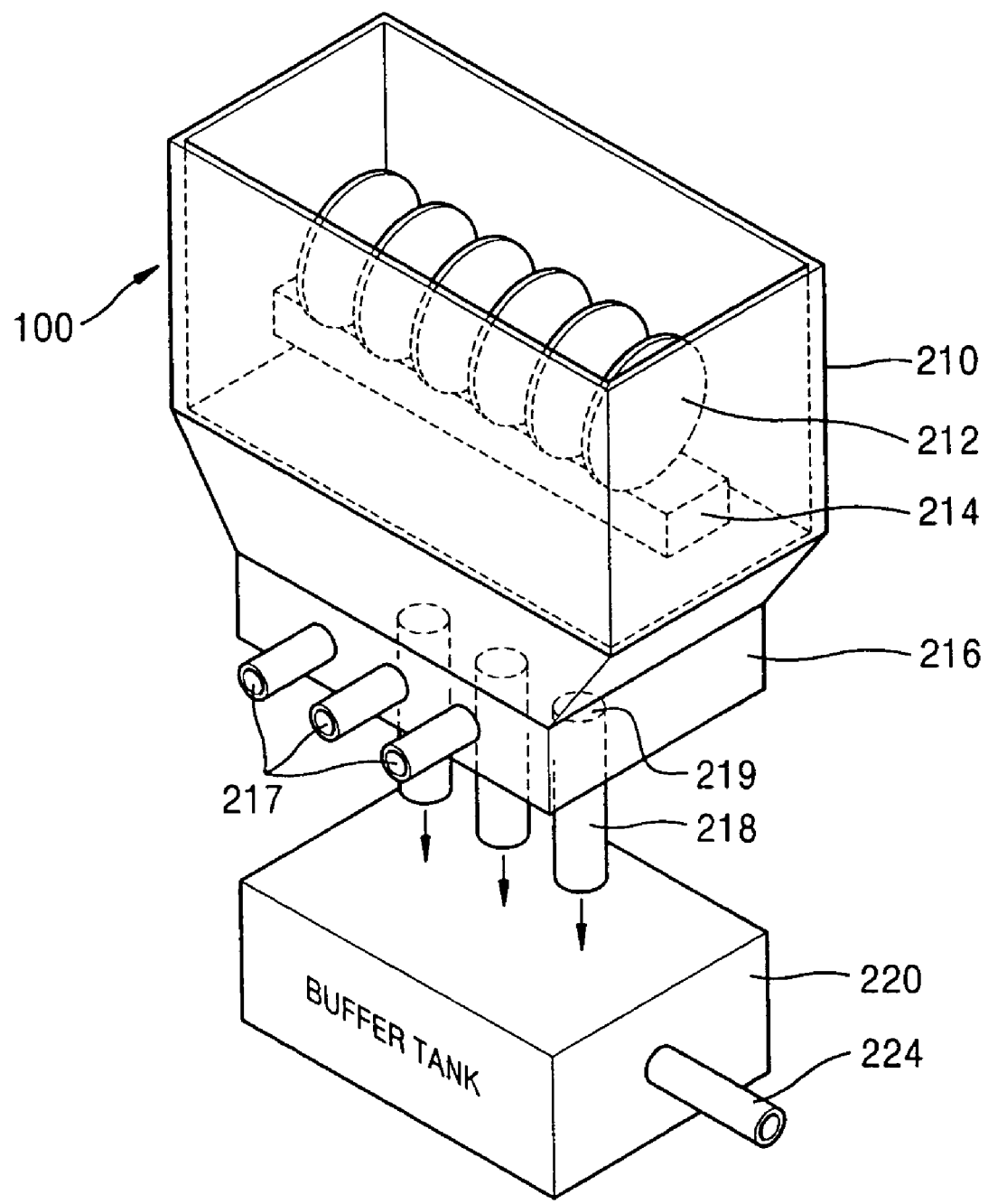
FIG. 5 is a block diagram of a process chamber draining system in accordance with the present invention.

FIG. 5 is a block diagram of the process chamber 100, including a draining system that provides for rapid draining of the chamber in accordance with the present invention. The process chamber 100 includes a bath 210 capable of processing multiple wafers, for example 50 semiconductor wafers 212, at a time. The wafers are supported by support 214. At a bottom region 216 of the bath 210, a plurality of drain openings 219 are provided. A plurality of exhaust port openings 217 are also provided. The respective drain openings 219 are relatively wide in cross section to allow for rapid draining of fluid, for example, the DI water fluid, from the bath 210. The drain openings 219 are coupled to multiple drain lines 218, which transport the rapidly discharged fluid into a buffer tank 220. The buffer tank preferably has a volume at least as large as the volume of the bath 210, so that it can receive the entire content of the bath liquid all at once, without hindering the flow of liquid.

The multiple drain openings 219 and multiple drain lines 218, are preferably distributed across the lower side 216 of the bath 210. This configuration ensures that, during draining, the fluid being drained remains level and flat as it is drained, in turn ensuring the same exposure time for the different wafers being processed in the bath, irrespective of where the wafers are located in the bath 210 relative to the drain outlet 219. This feature overcomes a funneling phenomenon that would otherwise occur if a single drain were to be used, which would lead to different exposure times for the different wafers, the exposure times corresponding to their positions relative to the single drain location.

Similarly, the multiple exhaust ports 217 are included in the bath for ensuring an even distribution, i.e. laminar flow, of the decontaminating and drying vapors in the bath 210.

Following the quick drain procedure, when the IPA and $N_2$ gases are introduced for the decontamination step, the multiple exhaust ports 217 are opened to allow for the even flow of decontamination vapors across the wafers. This avoids the problem associated with a single exhaust port, which would tend to concentrate the vapor flow in certain regions of the bath, for example due to eddy currents. In a preferred embodiment, the exhaust ports 217 remain open during the decontamination step and the drying step, and are optionally open, when needed, during the quick-drain step.

In this manner, the present invention increases semiconductor fabrication productivity. To increase productivity, the drain time of DI water is aggressively shortened by use of the quick-drain procedure. Watermarks remaining on the wafers as a result of the quick drain process are then efficiently removed by precisely controlling the ratio of nitrogen gas to IPA gas during the decontamination procedure. In this manner, process throughput is enhanced, in a manner that lends itself well to high process quality.

Figure 6:
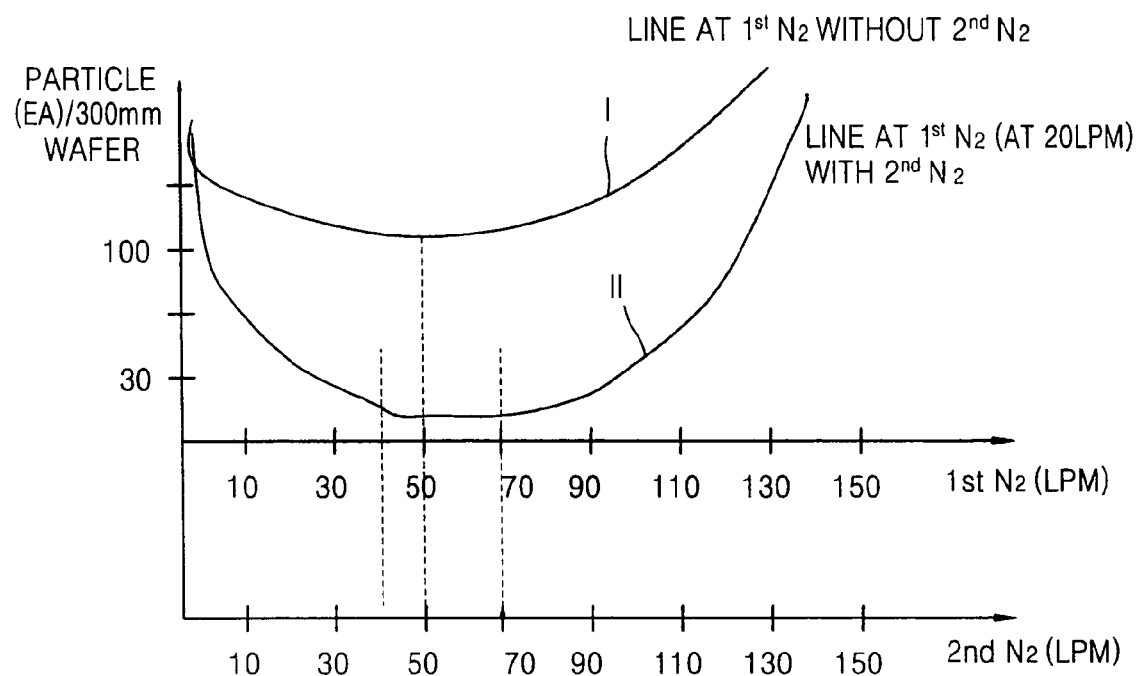
FIG. 6 is a chart illustrating remanent particle density as a function of the rate of flow of nitrogen vapor, in accordance with the present invention.

FIG. 6 is a chart illustrating remanent particle density as a function of the rate of flow of nitrogen vapor, in accordance with the present invention. An experiment was conducted to determined the effectiveness of the decontamination step where the second, independent heated nitrogen source 104B was included, for improving control over the IPA-to-nitrogen ratio in the decontaminating fluid introduced into the process chamber 100. In this experiment, the first heater 106A, second heater 106B, and line heater 130 were set at a temperature of 130 C. The IPA tank heater 122 was set at a temperature of 65 C. The chamber exhaust pressure was set at 75 mmH$_2$O.

In a first experiment, represented by plot I of FIG. 6, the first nitrogen source 104A was activated, for driving the IPA vapor, and the second nitrogen source 104B was dormant. In this case, optimal flow rate of the first nitrogen source 104A is determined to be at the minimum of the curve, or at about 50 liters per minute (LPM), resulting in over 100 particles remaining per 300 mm wafer.

In a second experiment, represented by plot II, the first nitrogen source 104A and second nitrogen source 104B were both activated, the first source 104A being set at 20 LPM for driving the IPA vapor, and the second source 104B for supplying additional nitrogen into the process chamber 100 for improved control over the IPA-to-nitrogen ratio in the chamber. In this case, the minimum of the plot II curve fell over a range of about 40–70 LPM flow of the second nitrogen source 104B, for which particle density was on the order of less than 30 particles remaining per 300 mm wafer.

Figure 7:
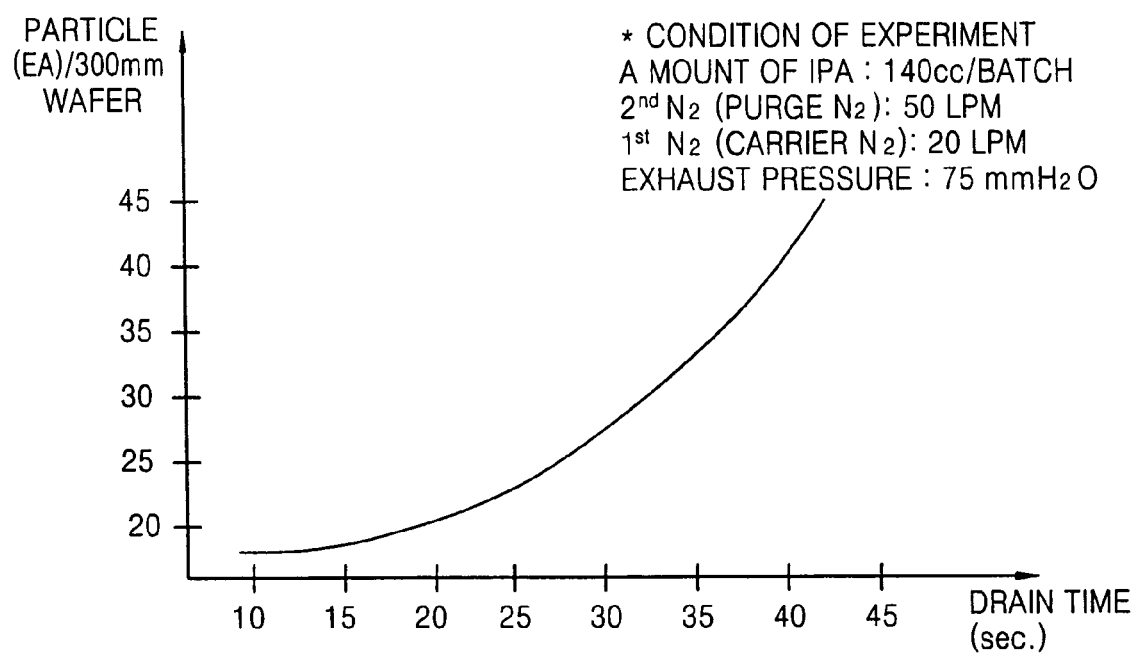
FIG. 7 is a chart illustrating remanent particle density as a function of drain time, in accordance with the present invention.

FIG. 7 is a chart illustrating remanent particle density as a function of drain time, in accordance with the present invention. Assuming the conditions of the above experiment, with the first nitrogen source 104A operating at a flow rate of 20 LPM, and with the second nitrogen source 104B operating at a flow rate of 50 LPM, and assuming 140 cc of IPA being used for the decontamination step, remanent particle density was determined as a function of drain time. It can clearly be seen in the chart that as drain time is reduced, the remanent particle density improved. In the range of 7–17 seconds of drain time, particle density was on the order of less than 20 particles remaining per 300 mm wafer.

Figure 8:
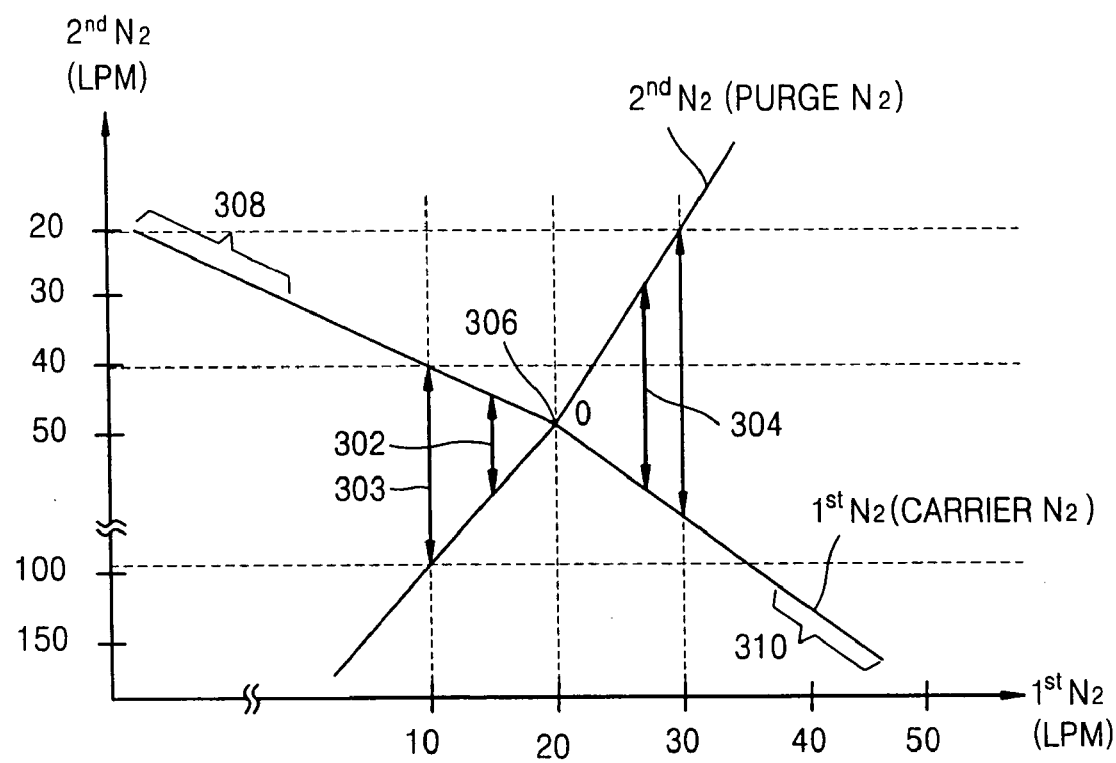
FIG. 8 is a chart that illustrates the selection of optimal flow rates for the carrier nitrogen vapor and the purge nitrogen vapor, in accordance with the present invention.

FIG. 8 is a chart that illustrates the selection of optimal flow rates for the first "carrier" nitrogen source 140A and the second "purge" nitrogen source 140B, in accordance with the present invention. In region 308 of the chart, the carrier nitrogen source is at too small of a flow rate to properly dry the wafers. In region 310 of the chart, too much carrier nitrogen is present, and, as a result, too much IPA vapor is presented to the wafers, resulting in IPA gel formation on the wafers and in the process chamber. Regions 302 and 304 of the chart indicate preferred combinations of carrier nitrogen and purge nitrogen levels that lead to preferred IPA-to-nitrogen ratios in the process chamber. Arrow 303, for example, indicates a carrier nitrogen flow rate of 10 LPM and a purge nitrogen flow rate of 100 LPM. An optimal condition exists at the intersection of the charts at point O 306, where the carrier nitrogen flow rate is 20 LPM and the purge nitrogen flow rate is 50 LPM.

While this invention has been particularly shown and described with references to preferred embodiments thereof, it will be understood by those skilled in the art that various changes in form and details may be made herein without departing from the spirit and scope of the invention as defined by the appended claims.

We claim:

1. A method for processing semiconductor wafers comprising:
   providing a first supply of drying fluid at a first rate of supply;
   providing a second supply of drying fluid at a second rate of supply, the second rate of supply of the second supply of drying fluid being independent of the first rate of supply of the first supply of drying fluid, the first supply of drying fluid at the first rate of supply being provided at the same time as the second supply of drying fluid at the second rate of supply;
   storing a supply of decontaminating fluid in a decontaminating fluid tank, the decontaminating fluid tank having an inlet for receiving the second supply of drying fluid, and having an outlet for supplying a combination of the second supply of drying fluid and the decontaminating fluid at a rate that is based on the second rate of supply of the second supply of drying fluid;
   simultaneously supplying the first supply of drying fluid and the combination of the second supply of drying fluid and the decontaminating fluid to a process chamber to decontaminate semiconductor wafers contained therein; and
   controlling a first ratio of drying fluid to decontaminating fluid in the process chamber by controlling the first rate of supply of the first supply of drying fluid and independently controlling the second rate of supply of the second supply of drying fluid so that the first ratio of drying fluid to decontaminating fluid in the process chamber is different than a second ratio of drying fluid to decontaminating fluid in the combination of the second supply of the drying fluid and the decontaminating fluid at the outlet of the fluid tank, to optimize the decontamination of the semiconductor wafers.

2. The method of claim 1 wherein the first supply of drying fluid comprises nitrogen gas.

3. The method of claim 1 further comprising heating the first supply of drying fluid prior to release in the process chamber.

4. The method of claim 1 wherein the second supply of drying fluid comprises nitrogen gas.

5. The method of claim 1 further comprising heating the second supply of drying fluid prior to release in the decontaminating fluid tank.

6. The method of claim 1 further comprising heating at least a portion of the decontaminating fluid in the tank from a liquid state into a vapor state.

7. The method of claim 1 further comprising heating the first supply of drying fluid and the combination of the second supply of drying fluid and the decontaminating fluid prior to their release into the process chamber.

8. The method of claim 1 wherein the first supply of drying fluid and the combination of the second supply of drying fluid and the decontaminating fluid received at the process chamber are in a vapor state.

9. The method of claim 1 further comprising, prior to simultaneously supplying the first supply of drying fluid and the combination of the second supply of drying fluid and the decontaminating fluid to the process chamber:
   supplying rinsing fluid into the process chamber containing the semiconductor wafers for rinsing the semiconductor wafers; and rapidly draining the rinsing fluid from the process chamber.

10. The method of claim 9 further comprising rapidly draining the rinsing fluid into a buffer tank having a volume that is greater than or equal to the volume of the process chamber.

11. The method of claim 9 wherein the rinsing fluid comprises deionized water in a liquid state.

12. The method of claim 9 wherein the rinsing fluid is completely drained prior to simultaneously supplying the first supply of drying fluid and the combination of the second supply of drying fluid and the decontaminating fluid to the process chamber.

13. The method of claim 1 further comprising, following simultaneously supplying the first supply of drying fluid and the combination of the second supply of drying fluid and the decontaminating fluid to the process chamber, supplying a drying fluid into the chamber for drying the semiconductor wafers.

* * * * *

UNITED STATES PATENT AND TRADEMARK OFFICE
CERTIFICATE OF CORRECTION

| | | |
|---|---|---|
| PATENT NO. | : 7,186,299 B2 | |
| APPLICATION NO. | : 10/796507 | |
| DATED | : March 6, 2007 | |
| INVENTOR(S) | : Park et al. | |

It is certified that error appears in the above-identified patent and that said Letters Patent is hereby corrected as shown below:

Title page, item (5) Col. 2
In the References Cited section, under "U.S. Patent Documents," delete "6,284,055" and insert --6,284,044--

Signed and Sealed this

Tenth Day of July, 2007

JON W. DUDAS
*Director of the United States Patent and Trademark Office*